(12) United States Patent
Wu et al.

(10) Patent No.: US 12,043,892 B2
(45) Date of Patent: Jul. 23, 2024

(54) METHOD FOR PRODUCING MOLYBDENUM ALLOY TARGETS

(71) Applicant: Jiangsu CISRI HIPEX Technology Co., Ltd., Zhenjiang (CN)

(72) Inventors: Zhanfang Wu, Zhenjiang (CN); Lida Che, Zhenjiang (CN); Haofeng Li, Zhenjiang (CN); Pengjie Zhang, Zhenjiang (CN); Jing He, Zhenjiang (CN); Xiangyang Li, Zhenjiang (CN)

(73) Assignee: Jiangsu CISRI HIPEX Technology Co., Ltd., Zhenjiang (CN)

( * ) Notice: Subject to any disclaimer, the term of this patent is extended or adjusted under 35 U.S.C. 154(b) by 47 days.

(21) Appl. No.: 17/557,911

(22) Filed: Dec. 21, 2021

(65) Prior Publication Data
US 2023/0024291 A1 Jan. 26, 2023

(30) Foreign Application Priority Data
Jul. 19, 2021 (CN) .......................... 202110814084.2

(51) Int. Cl.
*B22F 3/15* (2006.01)
*B22F 3/04* (2006.01)
(Continued)

(52) U.S. Cl.
CPC ............ *C23C 14/3414* (2013.01); *B22F 3/04* (2013.01); *B22F 3/15* (2013.01); *B22F 3/24* (2013.01);
(Continued)

(58) Field of Classification Search
CPC .......... C23C 14/3414; B22F 3/04; B22F 3/15; B22F 3/24; B22F 2003/247;
(Continued)

(56) References Cited

U.S. PATENT DOCUMENTS

2018/0105901 A1 * 4/2018 Smarsly .................. C22C 1/058
2019/0221408 A1   7/2019 Eidenberger-Schober et al.

FOREIGN PATENT DOCUMENTS

CN   103320756 A * 9/2013
CN   110257784 A   9/2019
(Continued)

OTHER PUBLICATIONS

M. H. Bocanegra-Bernal, Hot Isostatic Pressing (HIP) technology and its applications to metals and ceramics, 2004, Kluwer Academic Publishers, Journal of Materials Science 39, pp. 6399-6420 (Year: 2004).*

(Continued)

*Primary Examiner* — Nicholas A Wang
*Assistant Examiner* — Maxwell Xavier Duffy
(74) *Attorney, Agent, or Firm* — Calfee, Halter & Griswold LLP

(57) ABSTRACT

The present invention relates to a method for producing a molybdenum alloy target, and solves the problem of low density and coarser grains of the molybdenum alloy targets in the prior art. The present invention comprises subjecting a mixed powder with a mass ratio depending upon the formula composition of a molybdenum alloy to a pre-press forming process to obtain a preformed molybdenum alloy target blank; placing the preformed molybdenum alloy target blank in a capsule and subjecting the capsule to processes of preheating for degassing and vacuum seal welding; subjecting the target blank to a hot isostatic pressing process to obtain a densified molybdenum alloy prefabricated target; removing the capsule; and subjecting the molybdenum alloy prefabricated target with the capsule removed to a temperature-rising and pressure-decreasing process, followed by finish machining to obtain a molybdenum alloy target.

6 Claims, 2 Drawing Sheets

(51) Int. Cl.
*B22F 3/24* (2006.01)
*C23C 14/34* (2006.01)

(52) U.S. Cl.
CPC ... *B22F 2003/247* (2013.01); *B22F 2003/248* (2013.01); *B22F 2201/20* (2013.01); *B22F 2301/20* (2013.01); *B22F 2998/10* (2013.01)

(58) Field of Classification Search
CPC ............ B22F 2003/248; B22F 2201/20; B22F 2301/20; B22F 2998/10; B22F 1/052; C22C 27/04; C22C 1/045
See application file for complete search history.

(56) References Cited

FOREIGN PATENT DOCUMENTS

| CN | 111230096 A | * | 6/2020 | |
|---|---|---|---|---|
| CN | 111850490 A | | 10/2020 | |
| CN | 113174573 A | | 7/2021 | |
| JP | 2003226964 A | * | 8/2003 | |
| JP | 2011225985 A | * | 11/2011 | |
| WO | WO-2009107763 A1 | * | 9/2009 | ................ B22F 3/15 |

OTHER PUBLICATIONS

Search and Examination Report from GB Application No. 2117954.4 dated May 30, 2022 (5 pages).

* cited by examiner 500 mm by using the sintering
METHOD FOR PRODUCING MOLYBDENUM ALLOY TARGETS

CROSS-REFERENCE TO RELATED APPLICATIONS

This application claims priority to Chinese Patent Application No. 202110814084.2, filed on Jul. 19, 2021, which is hereby incorporated by reference in its entirety.

TECHNICAL FIELD

The present invention relates to the field of sputtering target fabrication and, more particularly, to a method for producing a molybdenum alloy target.

BACKGROUND ART

With the rapid development of the electronic information industry, the applications of thin film science are more and more extensive. Sputtering method is one of the major techniques for making thin film materials, and one of the starting materials for depositing thin films by sputtering is the target. The thin film sputter deposited with the target has high density and good adhesion. Since the 1990s, with the rapid development of new devices and materials in the microelectronics industry, thin films (such as electronic, magnetic, optical, photovoltaic and superconducting thin films) have been widely used in areas of high technology and industry, which facilitates the growing expansion of the sputtering targets market. At present, metal targets have become a flourishing specialized industry. Currently, flat panel displays (FPD), including liquid crystal display, plasma display, and touch screen, have become the mainstream of displays and have increasingly been applied to all aspects of our lives. In the present flat panel display industry, films are mainly formed by magnetron sputtering using chromium as the target to produce wires and isolation films. However, chromium is gradually replaced by molybdenum alloy for its harm to human and environment.

With the rapid development of sputtering deposition technology, new target producing methods are constantly emerging. Presently, the producing methods of targets used in the sputtering deposition include sintering process, extrusion process, casting process and hot isostatic pressing (HIP) process, each of which has advantages and disadvantages. Concretely speaking, it produces only a single target with a length of less than about 500 mm by using the sintering process. Also, there are many limitations in the extrusion process and casting process, such as inability to apply to producing non-metallic targets and high-performance targets.

As technology continues developing, the performance requirements for molybdenum thin films are increasing, which raises higher requirements on the densification and tissue structure uniformity of the molybdenum alloy sputtering targets. Hot isostatic pressing is a currently more advanced method for preparing sputtering targets. However, when the conventional production method of sintering combined with hot isostatic pressing technique is used to make the molybdenum alloy targets, it suffers from mainly two drawbacks of low density and coarse grains.

In conclusion, there is an urgent need for a new producing method to solve the problems resulted from low density and coarse grains of the molybdenum alloy targets.

SUMMARY OF THE DISCLOSURE

In view of the above analysis, embodiments of the present invention are directed to a method for producing a molybdenum alloy target to solve the problems of low density and coarser grains of the molybdenum alloy targets produced by the existing methods.

The present invention provides a method for producing a molybdenum alloy target comprising the following steps:

step 1: taking powders of alloy components depending upon the formula composition of a molybdenum alloy to obtain a mixed powder;

step 2: subjecting the mixed powder to a pre-press forming process to obtain a preformed molybdenum alloy target blank;

step 3: placing the preformed molybdenum alloy target blank in a capsule and subjecting the capsule to processes of preheating for degassing and vacuum seal welding;

step 4: placing the molybdenum alloy target blank sealed in the capsule in a hot isostatic pressing furnace for a hot isostatic pressing process to obtain a densified molybdenum alloy prefabricated target;

step 5: subjecting the densified molybdenum alloy prefabricated target to a mechanical processing for removing the capsule;

step 6: subjecting the molybdenum alloy prefabricated target with the capsule removed to a temperature-rising and pressure-decreasing process, followed by a finish machining to obtain a molybdenum alloy target; wherein the temperature-rising and pressure-decreasing process has a higher temperature and a lower pressure than the hot isostatic pressing process of the step 4.

Further, in the step 1 above, in the powders of alloy components, the molybdenum powder has an average Fisher particle size of 3.3 µm to 5.0 µm, and the niobium powder has an average Fisher particle size of 45 µm to 75 µm.

Further, in the step 1 above, the powders are charged in a mixer for a three-dimensional mixing under the protection of argon and the time for the three-dimensional mixing is 2 to 4 hours.

Further, in the step 2 above, the pre-press forming process is cold isostatic pressing, and the cold isostatic pressing process has parameters of a pre-pressing pressure of 250 MPa to 300 MPa and a pre-pressing time of 20 min to 40 min.

Further, in the step 2 above, the relative density of the preformed molybdenum alloy target blank is 50% to 65%.

Further, in the step 3 above, the temperature in the process of preheating for degassing is 400° C. to 500° C. and the vacuum level in the process of vacuum seal welding is less than $6 \times 10^{-3}$ Pa.

Further, in the hot isostatic pressing process of the step 4 above, the pressure is 130 MPa to 150 MPa, the temperature is 1100° C. to 1200° C., and the time for keeping the pressure and temperature is 3 h to 4 h.

Further, in the temperature-rising and pressure-decreasing process of the step 6 above, the pressure is 120 MPa to 130 MPaa, the temperature is 1250° C. to 1400° C., and the time for keeping the pressure and temperature is 1 h to 2 h.

Further, the molybdenum alloy target has a relative density of 99.6% to 99.9% and an average grain size of 60 µm to 90 µm.

Further, the molybdenum alloy described above contains niobium, and the mass ratio of molybdenum to niobium is Mo:Nb=9:1.

In contrast to the prior art, the present invention may achieve at least one of the following beneficial effects.

1. As can be seen from the examples of the present invention, the molybdenum alloy target prepared may have a density of 99.9%, and has advantages of fine grain size, excellent mechanical performance and good electrical and thermal conductivity, satisfying the market demands of the molybdenum alloy targets for high density and fine grain size. The present invention is well designed to be able to effectively solve the aforementioned problems and is significant for the optimization of the preparation method of the molybdenum alloys.

2. In the producing method of the present invention, the cold isostatic pressing is used for pre-press forming to reduce the deformation caused during the subsequent hot isostatic pressing process, thereby improving the yield of the molybdenum alloy target; then the hot isostatic pressing process is conducted to eliminate the through holes from the inside to the surface of the pre-fabricated target providing a target blank without the through holes for the temperature-rising and pressure-decreasing process of the next step; and the temperature-rising and pressure-decreasing process makes the target to be more dense and having fine grains.

3. The producing method of the present invention is simple and easy to operate, the preformed molybdenum alloy target blank has a regular shape which makes it easy to manufacture the capsule used in the hot isostatic pressing and the capsule is also easy to remove.

4. The molybdenum alloy target obtained in the present invention has high density and fine grains, in which the holding time at high temperature range is short (only 1 to 2 h) due to the temperature-rising and pressure-decreasing process, thereby rendering the molybdenum alloy target obtained having dense structure as well as fine grains.

In the present invention, the technical solutions described above may also be combined with each other to achieve more preferred combinations. Additional features and advantages of the invention will be set forth in the description which follows, and in part will be obvious from the description, or may be learned by the practice of the invention. Objects and other advantages of the invention may be realized and attained by what is particularly pointed out in the specification and drawings.

BRIEF DESCRIPTION OF DRAWINGS

The drawings are only for purposes of illustrating particular embodiments and are not to be construed as limiting the invention, wherein like reference numerals refer to corresponding parts throughout.

DETAILED DESCRIPTION

Preferred embodiments of the present invention are described in detail below with reference to the accompanying drawings, which form a part hereof, and which together with the description serve to explain the principles of the invention and are not intended to limit the scope of the invention.

It should be noted that, with the progress of science and technology, sputtering target with higher density and finer grain size is required in the field of sputtering target technology due to its advantages of good electrical and thermal conductivity and high strength. There are characteristics of low sputtering power, high film formation rate, low film cracking and long target lifetime using the target with higher density and finer grain size in the sputter coating and the sputtered film obtained has low resistivity and high transmittance. In the process of sputtering, if pores are present inside the target, the gases in the pores may be suddenly released during high temperature operation, causing large or small size target particles to splash; or the film obtained is subjected to a secondary electron bombardment causing particles to splash, and all of the particles can degrade the quality of the film. The finer the grain size of the target is, the more uniform the thickness distribution of the sputtered film is and the faster the sputtering rate becomes. To reduce the porosity in the targets and improve the film quality, it is generally desirable for the target to have higher density and finer grains.

Figure 1:
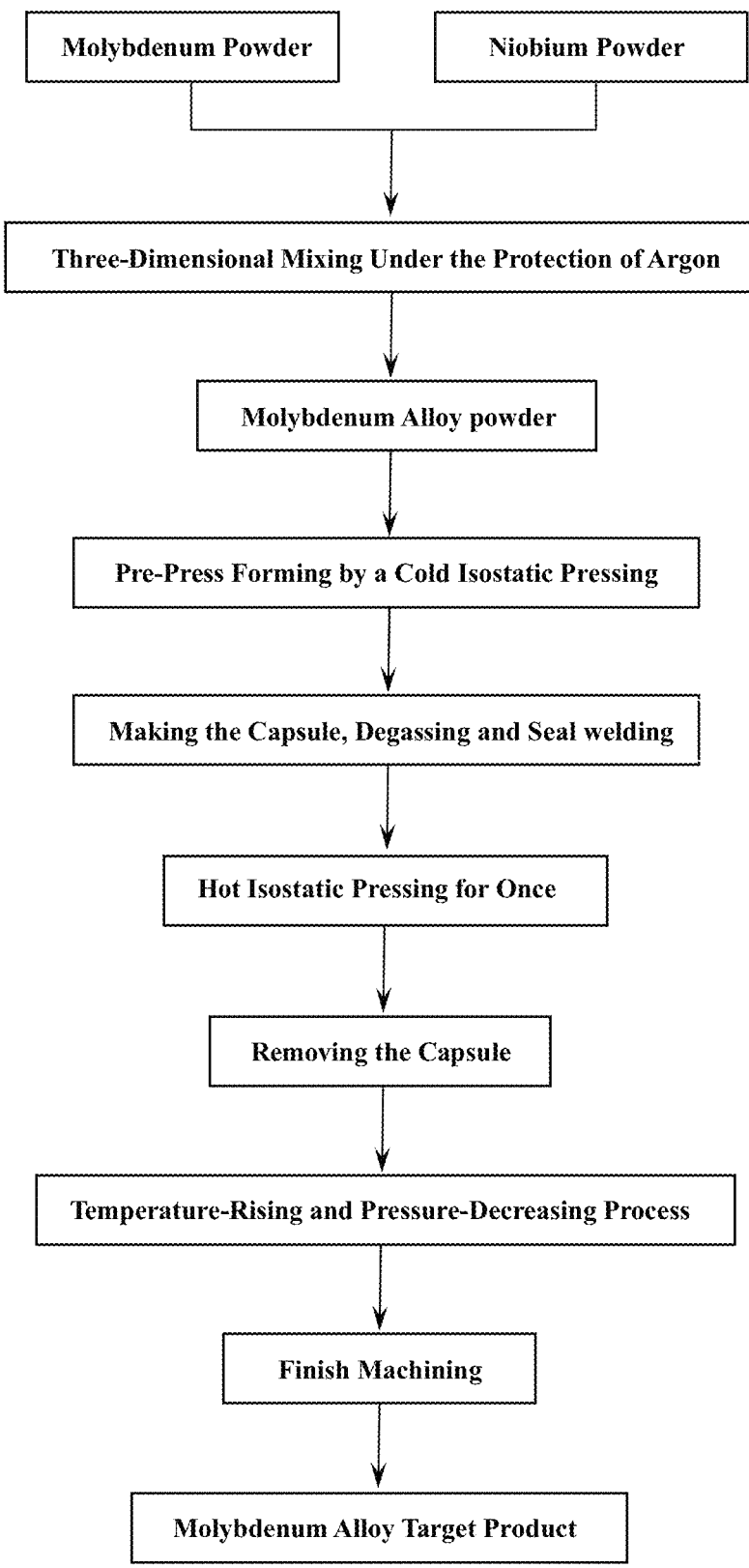
FIG. 1 is a schematic view of a method for producing a molybdenum alloy target in accordance with the present invention.
Figure 2:
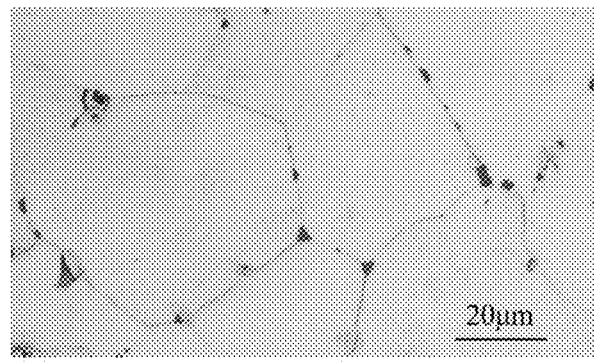
FIG. 2 is microstructure of a molybdenum alloy target obtained by the producing method of Example 4 of the present invention.
Figure 3:
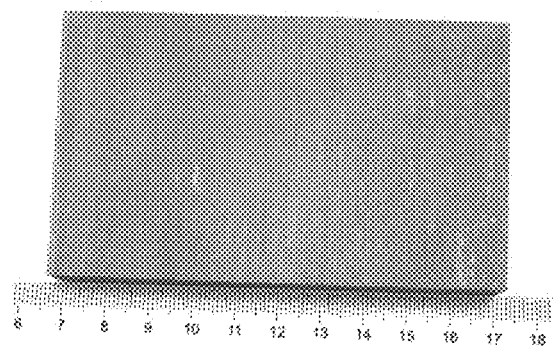
FIG. 3 shows a finished sheet of molybdenum alloy obtained by subjecting the molybdenum alloy target produced in accordance with Example 4 of the present invention to wire cutting.
Figure 4:
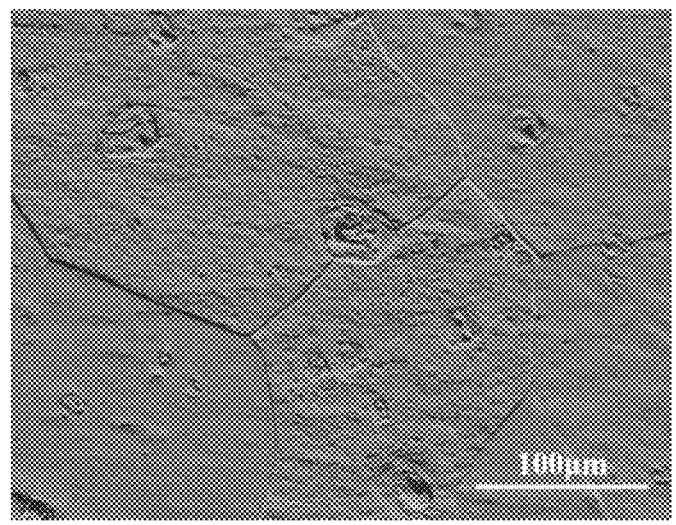
FIG. 4 is a scanning electron microscope photograph of the microstructure of the molybdenum alloy target in Comparative Example 1.

The present invention provides a method for producing a molybdenum alloy target with high density and fine grains with the process shown in FIG. 1 comprising the following steps:

step 1: taking powders of alloy components depending upon the formula composition of a molybdenum alloy with a mass ratio of Mo:Nb=9:1 and charging the powders in a mixer for a three-dimensional mixing in an oxygen-free atmosphere;

step 2: subjecting the mixed powder obtained in the step 1 to a pre-press forming process to obtain a preformed molybdenum alloy target blank;

step 3: placing the preformed molybdenum alloy target blank in a stainless steel capsule and subjecting the capsule to processes of preheating for degassing and vacuum seal welding;

step 4: placing the molybdenum alloy target blank sealed in the capsule in a hot isostatic pressing furnace for a hot isostatic pressing process to obtain a densified molybdenum alloy prefabricated target;

step 5: subjecting the densified molybdenum alloy prefabricated target obtained to a mechanical processing for removing the capsule;

step 6: subjecting the molybdenum alloy prefabricated target with the capsule removed to a temperature-rising and pressure-decreasing process, followed by a finish machining to obtain a molybdenum alloy target.

It should be noted that the temperature-rising and pressure-decreasing process in the step 6 refers to a process with a higher temperature and a lower pressure than the hot isostatic pressing process of the step 4. In other words, if the hot isostatic pressing process has a temperature of T1 and a pressure of P1 in the step 4, and the temperature-rising and pressure-decreasing process has a temperature of T2 and a pressure of P2 in the step 6, then T1<T2 and P1>P2 are satisfied between T1 and T2, and P1 and P2.

Preferably, 100° C.≤T2—T1≤300° C. and 10 MPa 30 MPa.

Compared to the prior art, the target blank is processed first by the hot isostatic pressing and then by the temperature-rising and pressure-decreasing process in the present invention, which render the molybdenum alloy target obtained having dense structure as well as fine grains and could satisfy the higher demands of the molybdenum alloy sputtering targets for high density and uniform structure.

Specifically, in the molybdenum alloy components of the step 1 above, the molybdenum powder has a purity of equal to or more than 99.5% and an average Fisher particle size of 3.3 µm to 5.0 µm; and the niobium powder has a purity of equal to or more than 99.5% and an average Fisher particle size of 45 µm to 75 µm. Pure molybdenum target is highly brittle and could not be produced properly. The addition of niobium can improve the toughness of the molybdenum target, and it is found over several experimental studies that the molybdenum alloy target produced with a mass ratio of Mo to Nb of 9:1 has the best properties.

Specifically, in the step 1 above, a vertical V-type mixer may be used with a stirring power of 1.1 kW, a stirring speed of 30 rpm to 40 rpm, and a three-dimensional mixing time of 2 to 4 hours.

Specifically, in the step 1 above, the three-dimensional mixing is conducted in an oxygen-free atmosphere in order to prevent the powder from absorbing oxygen and being oxidized, since the niobium powder is easily oxidized. The oxygen-free atmosphere is typically an argon atmosphere or vacuum.

Specifically, in the step 1 above, the powders weighed with a mass ratio of 9:1 are added to the mixer with argon introduced, and mixed for 2 h to 4 h at a stirring speed of 30 rpm to 40 rpm obtaining the mixed power.

Specifically, in the step 2 above, the relative density of the preformed molybdenum alloy target blank is 50% to 65%.

The mixed powder is directly filled into a stainless steel mold in the cold isostatic pressing process, and compacted by vibration constantly during the filling process to ensure the uniformity of the filled powders and avoid voids between the powder particles.

Specifically, in the step 2 above, the pre-pressing forming process is cold isostatic pressing, and the cold isostatic pressing process has parameters of a pre-pressing pressure of 250 MPa to 300 MPa and a pre-pressing time of 20 min to 40 min and the preformed molybdenum alloy target blank obtained has a relative density of 50% to 65% in preparation for the subsequent hot isostatic pressing.

It can increase the initial density and improve the low apparent density of the molybdenum alloy powder by using cold isostatic pressing (CIP) for performing. The preformed molybdenum alloy target blank has a regular shape which makes it easy to manufacture the capsule used in the hot isostatic pressing (HIP) and the capsule is also easy to remove. Specifically, in the cold isostatic pressing process, the pressure ranges from 250 MPa to 300 MPa, such as 250 MPa, 260 MPa, 270 MPa, 280 MPa and 300 MPa; the temperature is normal temperature and the pressure holding time is 20 min to 40 min, e.g., 20 min, 30 min and 40 min.

Specifically, in the step 3 above, the preformed molybdenum alloy target blank is placed in a stainless steel capsule and subjected to the processes of preheating for degassing and vacuum seal welding, wherein the preheating temperature is 400° C. to 500° C. and the vacuum level is generally less than $6 \times 10^{-3}$ Pa to ensure the complete removal of the oxygen.

The degassing step primarily removes air and water vapor, which are conducted for once at a temperature of 400° C. to 500° C., and the air and water vapor are removed completely.

The capsule containing the target blank is placed in a tank or furnace for heating and a narrow tube is reserved to connect the vacuum pump for vacuumizing. The heating process is started and a vacuum-pumping operation is performed. When the predetermined temperature is reached and the vacuum level is below $6 \times 10^{-3}$ Pa and no longer fluctuates, the reserved narrow tube is subjected to a process of seal welding. It is generally required that the predetermined temperature is above 200° C. and lower than the melting point of the metals of molybdenum and niobium. For the metals of molybdenum and niobium, the predetermined temperature may range from 400° C. to 500° C.

The hot isostatic pressing may be conducted in a closed environment using a 304 stainless steel capsule, thereby avoiding the loss of the molybdenum element.

Specifically, in the step 4 above, the hot isostatic pressing process has parameters of a pressure of 130 MPa to 150 MPa, a temperature of 1100° C. to 1200° C., and a holding time for the pressure and temperature of 3 h to 4 h.

The hot isostatic pressing (HIP) is conducted in an inert atmosphere (Ar) and under the combination of high temperature and high pressure to remove the holes and defects inside the material so as to improve the mechanical properties of the products, resulting in higher and uniform density.

The sealed capsule containing the target blank is placed on a work platform of a hot isostatic pressing apparatus which is heated according to a set heating procedure and charged with an inert gas, such as argon. The temperature rise rate is 2° C./min to 8° C./min, the pressure rise rate is 0.5 MPa/min to 1 MPa/min, the pressure in the hot isostatic press chamber is 130 MPa to 150 MPaa, the hot isostatic pressing temperature is 1100° C. and 1200° C., and the holding time for the pressure and temperature is controlled to 3 h to 4 h depending on the workpiece size. After completion of the keeping temperature, the temperature is reduced to a set temperature and the hot isostatic pressing process is completed.

The mechanical strength of the capsule material is reduced upon the temperature reaching the set value in the hot isostatic pressing apparatus, the pressure differential between the inside and outside of the capsule causes it to rapidly contract, and the pressure is transferred to the target blank in the capsule, thereby achieving rapid densification of the target blank with its densification increased. There is a significant shrinkage for the target blank in the sintering process and therefore the relative density of the target blank is increased from 50% to 65% after the cold isostatic pressing to 92% to 97% after the hot isostatic pressing. In addition, since the capsule is a closed container, it can restrain the evaporation of the molybdenum and niobium metal elements to the greatest extent, effectively controlling the amount of the molybdenum and niobium metal elements. Moreover, the hot isostatic pressing may also avoid the defects (such as mechanical cracks) within the target blank resulted from the conventional process of hot extrusion or forging used to increase the relative density of the target blank.

Specifically, in the step 6 above, the temperature-rising and pressure-decreasing process has parameters of a pressure of 120 MPa to 130 MPa, a temperature of 1250° C. to 1400° C., and a time for keeping the pressure and the temperature of 1 h to 2 h.

The temperature-rising and pressure-decreasing process above may be carried out by a hot isostatic pressing furnace, or other processing devices. In a preferred embodiment, the temperature-rising and pressure-decreasing process is performed in a hot isostatic pressing furnace.

It should be noted that the temperature-rising and pressure-decreasing process does not need the capsule. Preferably, after the hot isostatic pressing is completed, the temperature rise rate is 2° C./min to 8° C./min and the pressure rise rate is 0.5 MPa/min to 1 MPa/min for the molybdenum alloy prefabricated target with the capsule removed. In the temperature-rising and pressure-decreasing process, the pressure is 120 MPa to 130 MPa, the temperature is 1250° C. to 1400° C., and the time for keeping the pressure and the temperature is 1 h to 2 h.

Subjected to the temperature-rising and pressure-decreasing process, the relative density of the target blank may increase from 98% to 99.9% and the average grain size can be controlled to 60-90 When the conventional production method of sintering combined with hot isostatic pressing technique is used to make the molybdenum alloy targets, the sintering is generally conducted at high temperature to increase the density for the reason that the high temperature is good for the densification of the grains. However, it has been found by the inventors that the grains grow at the high temperature for a long time, rendering an insufficient densification in the hot isostatic pressing process. In the present invention, the hot isostatic pressing process is followed by the temperature-rising and pressure-decreasing process, and both of the temperature and pressure in the latter are lower than in the former. In the temperature-rising and pressure-decreasing process, the operation of keeping temperature is controlled at high temperature, and an example of the time for keeping the pressure and the temperature is 1 to 2 hours, thereby rendering the molybdenum alloy target obtained having dense structure as well as fine grains.

In addition, the target blank is typically placed vertically during the hot isostatic pressing process. Due to the influence of the rigid capsule structure and the gravity of the target blank itself, the target blank generally presents a large shrinkage in the middle and a small shrinkage at the upper and lower ends in the hot isostatic pressing process, and the irregular deformation increases the machining loss and affects the size of the target blank. In the present invention, the use of the temperature-rising and pressure-decreasing process after the hot isostatic pressing can also control and improve the uniformity of shrinkage of the target blank.

The formed target blank by the hot isostatic pressing is machined or chemically etched to remove the metal capsule with the outer layer deformed, obtaining a target blank that can be used for machining. The target blank is then machined to have corresponding specifications and surface roughness using a numerically controlled lathe according to actual production requirements.

In contrast to the prior art, in the present invention, the cold isostatic pressing is first used to make the target blank preliminarily formed and densified, then the densification of the target is further improved by the hot isostatic pressing, therefore enhancing the densification of the target by the combination of the cold isostatic pressing and the hot isostatic pressing.

Compared to the prior art, the target blank is first processed by the hot isostatic pressing and then processed by the temperature-rising and pressure-decreasing process in the present invention, wherein by the hot isostatic pressing, the relative density of the target blank of 50% to 65% after the cold isostatic pressing increases to 98% or more after the sintering process of the hot isostatic pressing, and which is further increased from 98% to 99.9% by the subsequent temperature-rising and pressure-decreasing process. Thus, the densification of the target is improved and its grain size is controlled, which render the molybdenum alloy target obtained having dense structure as well as fine grains and could satisfy the higher demands of the molybdenum alloy sputtering targets for high density and uniform structure.

In contrast to the prior art, the temperature-rising and pressure-decreasing process of the present invention has a shorter holding time at high temperature, thereby rendering the molybdenum alloy target obtained having dense structure as well as fine grains.

Example 1

The present example provides a method for producing a molybdenum alloy target with high density and fine grains using the method described above, and the process flow is shown in FIG. 1. Specific details are as follows.

Step 1: Three-Dimensional Mixing

Powders of molybdenum alloy components with a mass ratio of molybdenum to niobium of 9:1 were taken, in which the molybdenum powder had an average Fisher particle size of 3.3 µm to 5.0 µm and the niobium powder had an average Fisher particle size of 45 µm to 75 µm. The powders were charged into a vertical V-type mixer for a three-dimensional mixing under the protection of argon with a stirring power of 1.1 kW, a stirring speed of 30 rpm to 40 rpm, and a three-dimensional mixing time of 2 to 4 hours.

Step 2: Pre-Press Forming by a Cold Isostatic Pressing

The mixed molybdenum alloy powder was subjected to a cold isostatic pressing for pre-press forming in a cold isostatic pressing furnace to obtain a preformed molybdenum alloy target blank with a relative density of 50% to 65%. In the cold isostatic pressing process, the pre-pressing pressure was 250 MPa and the pre-pressing time is 35 min.

Step 3: Preheating, Degassing and Sealing Welding of Capsule

The preformed molybdenum alloy target blank was placed in a 304 stainless steel capsule and subjected to processes of preheating with a temperature is 400° C. to 500° C. and vacuum seal welding with a vacuum level of less than $6 \times 10^{-3}$ Pa.

Step 4: Hot Isostatic Pressing

After degassed and sealed, the molybdenum alloy target blank was placed in a hot isostatic pressing furnace for the hot isostatic pressing process with a pressure of 130 MPa, a temperature of 1100° C. and a holding time for the pressure and temperature of 3 h.

Step 5: Removal of the Capsule

After the process of the hot isostatic pressing, the molybdenum alloy target blank was taken out and subjected to a mechanical processing for removing the stainless steel capsule.

Step 6: Temperature-Rising and Pressure-Decreasing Process

The molybdenum alloy target blank with the capsule removed was placed in a hot isostatic pressing furnace for a temperature-rising and pressure-decreasing process with a pressure of 120 MPa, a temperature of 1250° C., and a time for keeping the pressure and the temperature of 1 h.

The molybdenum alloy target product obtaining in Example 1 has a size of 12 mm (thickness)×100 mm (width)×120 mm (length), a relative density of 99.6%, and an average grain size of 72 µm.

Example 2

The present example provides a method for producing a molybdenum alloy target with high density and fine grains using the method described above, and the process flow is shown in FIG. 1. Specific details are as follows.

Step 1: Three-Dimensional Mixing

Powders of molybdenum alloy components with a mass ratio of molybdenum to niobium of 9:1 were taken, in which the molybdenum powder had an average Fisher particle size of 3.3 μm to 5.0 μm and the niobium powder had an average Fisher particle size of 45 μm to 75 The powders were charged into a vertical V-type mixer for a three-dimensional mixing under the protection of argon with a stirring power of 1.1 kW, a stirring speed of 30 rpm to 40 rpm, and a three-dimensional mixing time of 2 to 4 hours.

Step 2: Pre-Press Forming by a Cold Isostatic Pressing

The mixed molybdenum alloy powder was subjected to a cold isostatic pressing for pre-press forming in a cold isostatic pressing furnace to obtain a preformed molybdenum alloy target blank with a relative density of 50% to 65%. In the cold isostatic pressing process, the pre-pressing pressure was 300 MPa and the pre-pressing time is 30 min.

Step 3: Preheating, Degassing and Sealing Welding of Capsule

The preformed molybdenum alloy target blank was placed in a 304 stainless steel capsule and subjected to processes of preheating with a temperature is 400° C. to 500° C. and vacuum seal welding with a vacuum level of less than $6\times10^{-3}$ Pa.

Step 4: Hot Isostatic Pressing

After degassed and sealed, the molybdenum alloy target blank was placed in a hot isostatic pressing furnace for the hot isostatic pressing process with a pressure of 140 MPa, a temperature of 1200° C. and a holding time for the pressure and temperature of 4 h.

Step 5: Removal of the Capsule

After the process of the hot isostatic pressing, the molybdenum alloy target blank was taken out and subjected to a mechanical processing for removing the stainless steel capsule.

Step 6: Temperature-Rising and Pressure-Decreasing Process

The molybdenum alloy target blank with the capsule removed was placed in a hot isostatic pressing furnace for a temperature-rising and pressure-decreasing process with a pressure of 120 MPa, a temperature of 1300° C., and a time for keeping the pressure and the temperature of 1 h.

The molybdenum alloy target product obtaining in Example 2 has a size of 12 mm (thickness)×100 mm (width)×120 mm (length), a relative density of 99.7%, and an average grain size of 75 μm.

Example 3

The present example provides a method for producing a molybdenum alloy target with high density and fine grains using the method described above, and the process flow is shown in FIG. 1. Specific details are as follows.

Step 1: Three-Dimensional Mixing

Powders of molybdenum alloy components with a mass ratio of molybdenum to niobium of 9:1 were taken, in which the molybdenum powder had an average Fisher particle size of 3.3 μm to 5.0 μm and the niobium powder had an average Fisher particle size of 45 μm to 75 μm. The powders were charged into a vertical V-type mixer for a three-dimensional mixing under the protection of argon with a stirring power of 1.1 kW, a stirring speed of 30 rpm to 40 rpm, and a three-dimensional mixing time of 2 to 4 hours.

Step 2: Pre-Press Forming by a Cold Isostatic Pressing

The mixed molybdenum alloy powder was subjected to a cold isostatic pressing for pre-press forming in a cold isostatic pressing furnace to obtain a preformed molybdenum alloy target blank with a relative density of 50% to 65%. In the cold isostatic pressing process, the pre-pressing pressure was 300 MPa and the pre-pressing time is 20 min.

Step 3: Preheating, Degassing and Sealing Welding of Capsule

The preformed molybdenum alloy target blank was placed in a 304 stainless steel capsule and subjected to processes of preheating with a temperature is 400° C. to 500° C. and vacuum seal welding with a vacuum level of less than $6\times10^{-3}$ Pa.

Step 4: Hot Isostatic Pressing

After degassed and sealed, the molybdenum alloy target blank was placed in a hot isostatic pressing furnace for the hot isostatic pressing process with a pressure of 150 MPa, a temperature of 1100° C. and a holding time for the pressure and temperature of 4 h.

Step 5: Removal of the Capsule

After the process of the hot isostatic pressing, the molybdenum alloy target blank was taken out and subjected to a mechanical processing for removing the stainless steel capsule.

Step 6: Temperature-Rising and Pressure-Decreasing Process

The molybdenum alloy target blank with the capsule removed was placed in a hot isostatic pressing furnace for a temperature-rising and pressure-decreasing process with a pressure of 130 MPa, a temperature of 1300° C., and a time for keeping the pressure and the temperature of 2 h.

The molybdenum alloy target product obtaining in Example 3 has a size of 12 mm (thickness)×100 mm (width)×120 mm (length), a relative density of 99.8%, and an average grain size of 85 μm.

Example 4

The present example provides a method for producing a molybdenum alloy target with high density and fine grains using the method described above, and the process flow is shown in FIG. 1. Specific details are as follows.

Step 1: Three-Dimensional Mixing

Powders of molybdenum alloy components with a mass ratio of molybdenum to niobium of 9:1 were taken, in which the molybdenum powder had an average Fisher particle size of 3.3 μm to 5.0 μm and the niobium powder had an average Fisher particle size of 45 μm to 75 The powders were charged into a vertical V-type mixer for a three-dimensional mixing under the protection of argon with a stirring power of 1.1 kW, a stirring speed of 30 rpm to 40 rpm, and a three-dimensional mixing time of 2 to 4 hours.

Step 2: Pre-Press Forming by a Cold Isostatic Pressing

The mixed molybdenum alloy powder was subjected to a cold isostatic pressing for pre-press forming in a cold isostatic pressing furnace to obtain a preformed molybdenum alloy target blank with a relative density of 50% to 65%. In the cold isostatic pressing process, the pre-pressing pressure was 300 MPa and the pre-pressing time is 30 min.

Step 3: Preheating, Degassing and Sealing Welding of Capsule

The preformed molybdenum alloy target blank was placed in a 304 stainless steel capsule and subjected to processes of preheating with a temperature is 400° C. to 500° C. and vacuum seal welding with a vacuum level of less than $6\times10^{-3}$ Pa.

Step 4: Hot Isostatic Pressing

After degassed and sealed, the molybdenum alloy target blank was placed in a hot isostatic pressing furnace for the hot isostatic pressing process with a pressure of 150 MPa, a temperature of 1100° C. and a holding time for the pressure and temperature of 3 h.

Step 5: Removal of the Capsule

After the process of the hot isostatic pressing, the molybdenum alloy target blank was taken out and subjected to a mechanical processing for removing the stainless steel capsule.

Step 6: Temperature-Rising and Pressure-Decreasing Process

The molybdenum alloy target blank with the capsule removed was placed in a hot isostatic pressing furnace for a temperature-rising and pressure-decreasing process with a pressure of 130 MPa, a temperature of 1400° C., and a time for keeping the pressure and the temperature of 1 h.

The molybdenum alloy target product obtaining in Example 4 has a size of 12 mm (thickness)×100 mm (width)×120 mm (length), a relative density of 99.8%, and an average grain size of 67 μm.

Example 5

The present example provides a method for producing a molybdenum alloy target with high density and fine grains using the method described above, and the process flow is shown in FIG. 1. Specific details are as follows.

Step 1: Three-Dimensional Mixing

Powders of molybdenum alloy components with a mass ratio of molybdenum to niobium of 9:1 were taken, in which the molybdenum powder had an average Fisher particle size of 3.3 μm to 5.0 μm and the niobium powder had an average Fisher particle size of 45 μm to 75 μm. The powders were charged into a vertical V-type mixer for a three-dimensional mixing under the protection of argon with a stirring power of 1.1 kW, a stirring speed of 30 rpm to 40 rpm, and a three-dimensional mixing time of 2 to 4 hours.

Step 2: Pre-Press Forming by a Cold Isostatic Pressing

The mixed molybdenum alloy powder was subjected to a cold isostatic pressing for pre-press forming in a cold isostatic pressing furnace to obtain a preformed molybdenum alloy target blank with a relative density of 50% to 65%. In the cold isostatic pressing process, the pre-pressing pressure was 300 MPa and the pre-pressing time is 30 min.

Step 3: Preheating, Degassing and Sealing Welding of Capsule

The preformed molybdenum alloy target blank was placed in a 304 stainless steel capsule and subjected to processes of preheating with a temperature is 400° C. to 500° C. and vacuum seal welding with a vacuum level of less than $6\times10^{-3}$ Pa.

Step 4: Hot Isostatic Pressing

After degassed and sealed, the molybdenum alloy target blank was placed in a hot isostatic pressing furnace for the hot isostatic pressing process with a pressure of 150 MPa, a temperature of 1100° C. and a holding time for the pressure and temperature of 4 h.

Step 5: Removal of the Capsule

After the process of the hot isostatic pressing, the molybdenum alloy target blank was taken out and subjected to a mechanical processing for removing the stainless steel capsule.

Step 6: Temperature-Rising and Pressure-Decreasing Process

The molybdenum alloy target blank with the capsule removed was placed in a hot isostatic pressing furnace for a temperature-rising and pressure-decreasing process with a pressure of 120 MPa, a temperature of 1400° C., and a time for keeping the pressure and the temperature of 1 h.

The molybdenum alloy target product obtaining in Example 5 has a size of 12 mm (thickness)×100 mm (width)×120 mm (length), a relative density of 99.9%, and an average grain size of 67 μm.

Example 6

The present example provides a method for producing a molybdenum alloy target with high density and fine grains using the method described above, and the process flow is shown in FIG. 1. Specific details are as follows.

Step 1: Three-Dimensional Mixing

Powders of molybdenum alloy components with a mass ratio of molybdenum to niobium of 9:1 were taken, in which the molybdenum powder had an average Fisher particle size of 3.3 μm to 5.0 μm and the niobium powder had an average Fisher particle size of 45 μm to 75 The powders were charged into a vertical V-type mixer for a three-dimensional mixing under the protection of argon with a stirring power of 1.1 kW, a stirring speed of 30 rpm to 40 rpm, and a three-dimensional mixing time of 2 to 4 hours.

Step 2: Pre-Press Forming by a Cold Isostatic Pressing

The mixed molybdenum alloy powder was subjected to a cold isostatic pressing for pre-press forming in a cold isostatic pressing furnace to obtain a preformed molybdenum alloy target blank with a relative density of 50% to 65%. In the cold isostatic pressing process, the pre-pressing pressure was 250 MPa and the pre-pressing time is 40 min.

Step 3: Preheating, Degassing and Sealing Welding of Capsule

The preformed molybdenum alloy target blank was placed in a 304 stainless steel capsule and subjected to processes of preheating with a temperature is 400° C. to 500° C. and vacuum seal welding with a vacuum level of less than $6\times10^{-3}$ Pa.

Step 4: Hot Isostatic Pressing

After degassed and sealed, the molybdenum alloy target blank was placed in a hot isostatic pressing furnace for the hot isostatic pressing process with a pressure of 150 MPa, a temperature of 1100° C. and a holding time for the pressure and temperature of 4 h.

Step 5: Removal of the Capsule

After the process of the hot isostatic pressing, the molybdenum alloy target blank was taken out and subjected to a mechanical processing for removing the stainless steel capsule.

Step 6: Temperature-Rising and Pressure-Decreasing Process

The molybdenum alloy target blank with the capsule removed was placed in a hot isostatic pressing furnace for a temperature-rising and pressure-decreasing process with a pressure of 130 MPa, a temperature of 1400° C., and a time for keeping the pressure and the temperature of 1 h.

The molybdenum alloy target product obtaining in Example 6 has a size of 12 mm (thickness)×100 mm (width)×120 mm (length), a relative density of 99.9%, and an average grain size of 69 μm.

Comparative Example 1

The present comparative example provides a method for producing a molybdenum alloy target using the method described above, in which the hot isostatic press is used just once. Specific details are as follows.

Step 1: Three-Dimensional Mixing

Powders of molybdenum alloy components with a mass ratio of molybdenum to niobium of 9:1 were taken, in which the molybdenum powder had an average Fisher particle size of 3.3 μm to 5.0 μm and the niobium powder had an average Fisher particle size of 45 μm to 75 μm. The powders were charged into a vertical V-type mixer for a three-dimensional mixing under the protection of argon with a stirring power of 1.1 kW, a stirring speed of 30 rpm to 40 rpm, and a three-dimensional mixing time of 2 to 4 hours.

Step 2: Pre-Press Forming by a Cold Isostatic Pressing

The mixed molybdenum alloy powder was subjected to a cold isostatic pressing for pre-press forming in a cold isostatic pressing furnace to obtain a preformed molybdenum alloy target blank with a relative density of 50% to 65%. In the cold isostatic pressing process, the pre-pressing pressure was 300 MPa and the pre-pressing time is 30 min.

Step 3: Preheating, Degassing and Sealing Welding of Capsule

The preformed molybdenum alloy target blank was placed in a 304 stainless steel capsule and subjected to processes of preheating with a temperature is 400° C. to 500° C. and vacuum seal welding with a vacuum level of less than $6\times10^{-3}$ Pa.

Step 4: Hot Isostatic Pressing

After degassed and sealed, the molybdenum alloy target blank was placed in a hot isostatic pressing furnace for the hot isostatic pressing process with a pressure of 130 MPa, a temperature of 1200° C. and a holding time for the pressure and temperature of 4 h.

Step 5: Removal of the Capsule

After the process of the hot isostatic pressing, the molybdenum alloy target blank was taken out and subjected to a mechanical processing for removing the stainless steel capsule.

The molybdenum alloy target product obtaining in Comparative Example 1 has a size of 12 mm (thickness)×100 mm (width)×120 mm (length), a relative density of 97.7%, and an average grain size of 102 to 108

Comparative Example 2

The present comparative example provides a method for producing a molybdenum alloy target using the method described above, in which the hot isostatic press is used just once. Specific details are as follows.

Step 1: Three-Dimensional Mixing

Powders of molybdenum alloy components with a mass ratio of molybdenum to niobium of 9:1 were taken, in which the molybdenum powder had an average Fisher particle size of 3.3 μm to 5.0 μm and the niobium powder had an average Fisher particle size of 45 μm to 75 The powders were charged into a vertical V-type mixer for a three-dimensional mixing under the protection of argon with a stirring power of 1.1 kW, a stirring speed of 30 rpm to 40 rpm, and a three-dimensional mixing time of 2 to 4 hours.

Step 2: Pre-Press Forming by a Cold Isostatic Pressing

The mixed molybdenum alloy powder was subjected to a cold isostatic pressing for pre-press forming in a cold isostatic pressing furnace to obtain a preformed molybdenum alloy target blank with a relative density of 50% to 65%. In the cold isostatic pressing process, the pre-pressing pressure was 300 MPa and the pre-pressing time is 30 min.

Step 3: Preheating, Degassing and Sealing Welding of Capsule

The preformed molybdenum alloy target blank was placed in a 304 stainless steel capsule and subjected to processes of preheating with a temperature is 400° C. to 500° C. and vacuum seal welding with a vacuum level of less than $6\times10^{-3}$ Pa.

Step 4: Hot Isostatic Pressing

After degassed and sealed, the molybdenum alloy target blank was placed in a hot isostatic pressing furnace for the hot isostatic pressing process with a pressure of 150 MPa, a temperature of 1250° C. and a holding time for the pressure and temperature of 4 h.

Step 5: Removal of the Capsule

After the process of the hot isostatic pressing, the molybdenum alloy target blank was taken out and subjected to a mechanical processing for removing the stainless steel capsule.

The molybdenum alloy target product obtaining in Comparative Example 2 has a size of 12 mm (thickness)×100 mm (width)×120 mm (length), a relative density of 98.2%, and an average grain size of 97 to 156 μm.

The major producing process conditions and performance results of the molybdenum alloy targets in Examples 1-6 and Comparative Examples 1-2 are shown in Table 1.

TABLE 1

The Major Producing Process Conditions and Performance Results of the Molybdenum Alloy Targets in Examples 1-6 and Comparative Examples 1-2

| Number | Pre-Press Forming by a Cold Isostatic Pressing | | Hot Isostatic Pressing | | | Temperature-Rising and Pressure-Decreasing Process | | | Molybdenum Alloy Target Product | |
|---|---|---|---|---|---|---|---|---|---|---|
| | Pressure (MPa) | Time (min) | Pressure (MPa) | Temperature (° C.) | Time (h) | Pressure (MPa) | Temperature (° C.) | Time (h) | Relative Density (%) | Average Grain Size (μm) |
| Example 1 | 250 | 35 | 130 | 1100 | 3 | 120 | 1250 | 1 | 99.6 | 72 |
| Example 2 | 300 | 30 | 140 | 1200 | 4 | 120 | 1300 | 1 | 99.7 | 75 |
| Example 3 | 300 | 30 | 150 | 1100 | 4 | 130 | 1300 | 2 | 99.8 | 85 |
| Example 4 | 300 | 20 | 150 | 1100 | 3 | 130 | 1400 | 1 | 99.8 | 67 |
| Example 5 | 300 | 30 | 150 | 1100 | 4 | 120 | 1400 | 1 | 99.9 | 67 |
| Example 6 | 250 | 40 | 150 | 1100 | 4 | 130 | 1400 | 1 | 99.9 | 69 |
| Comparative Example 1 | 300 | 30 | 130 | 1200 | 4 | / | / | / | 97.7 | 102-180 |
| Comparative Example 2 | 300 | 30 | 150 | 1250 | 4 | / | / | / | 98.2 | 97-156 |

It can be seen from the comparison of the processes and product performances of Examples 1-6, that the relative density of the molybdenum alloy target products obtained from all the Examples are above 99.6%. The average grain size of the molybdenum alloy target products obtained in Example 4 and Example 5 are 67 μm much less than the requirement of below 200 μm for this type of target, and the relative density of the molybdenum alloy target product obtained in Example 5 is up to 99.9%, thus obtaining the molybdenum alloy target with high density and fine grains.

The temperature-rising and pressure-decreasing process of the Step 6 is absent in Comparative Examples 1 to 2 in which Steps 1 to 5 are the same as that in the Examples. It can be known from comparison of the product performance that the density of the products in Comparative Examples 1 to 2 are not as good as that of the products in Examples 1 to 6, and the grain is coarser.

In the temperature-rising and pressure-decreasing process of the present invention, the high temperature facilitates grain densification and the operation of keeping temperature is controlled at high temperature, thereby rendering the molybdenum alloy target obtained having dense structure as well as fine grains.

While the foregoing is merely a preferred embodiment of the present invention, it is not intended that the scope of the invention be limited thereto, and any changes and substitutions that will occur to those skilled in the art within the scope of the present invention are intended to be included within the scope of the present invention.

What is claimed is:

1. A method for producing a molybdenum alloy target comprising the following steps:
   step 1: taking powders of alloy components depending upon a formula composition of a molybdenum alloy to obtain a mixed powder;
   step 2: subjecting the mixed powder to a pre-press forming process to obtain a preformed molybdenum alloy target blank;
   step 3: placing the preformed molybdenum alloy target blank in a capsule and subjecting the capsule to processes of preheating for degassing and vacuum seal welding;
   step 4: placing the molybdenum alloy target blank sealed in the capsule in a hot isostatic pressing furnace for a hot isostatic pressing process to obtain a densified molybdenum alloy prefabricated target;
   step 5: subjecting the densified molybdenum alloy prefabricated target to a mechanical processing for removing the capsule; and
   step 6: subjecting the molybdenum alloy prefabricated target with the capsule removed to a temperature-rising and pressure-decreasing process, followed by a finish machining to obtain a molybdenum alloy target;
   wherein the temperature-rising and pressure-decreasing process has a higher temperature and a lower pressure than the hot isostatic pressing process of the step 4;
   the pre-press forming process is cold isostatic pressing, and the cold isostatic pressing process has parameters of a pre-pressing pressure of 250 MPa to 300 MPa and a pre-pressing time of 20 min to 40 min;
   wherein in the hot isostatic pressing process of the step 4, a pressure P1 is 130 MPa to 150 MPa, a temperature T1 is 1100° C. to 1200° C., and a time for keeping the pressure and temperature is 3 h to 4 h;
   wherein in the temperature-rising and pressure-decreasing process of the step 6, a pressure P2 is 120 MPa to 130 MPa, a temperature T2 is 1250° C. to 1400° C., and a time for keeping the pressure and temperature is 1 h to 2 h;
   wherein 100° C.≤T2−T1≤300° C. and 10 MPa≤P1−P2≤30 MPa;
   wherein the molybdenum alloy target has a relative density of 99.6% to 99.9% and an average grain size of 60 μm to 90 μm.

2. The method according to claim 1, wherein in the powders of alloy components of the step 1, a molybdenum powder has an average Fisher particle size of 3.3 μm to 5.0 μm, and a niobium powder has an average Fisher particle size of 45 μm to 75 μm.

3. The method according to claim 1, wherein in the step 1, the powders are charged in a mixer for a three-dimensional mixing under a protection of argon and a time for the three-dimensional mixing is 2 to 4 hours.

4. The method according to claim 1, wherein in the step 2, a relative density of the preformed molybdenum alloy target blank is 50% to 65%.

5. The method according to claim 1, wherein in the step 3, the temperature in the process of preheating for degassing is 400° C. to 500° C. and a vacuum level in the process of vacuum seal welding is less than 6×10⁻³ Pa.

6. The method according to claim 1, wherein the molybdenum alloy contains niobium, and a mass ratio of molybdenum to niobium is Mo:Nb=9:1.

* * * * *